United States Patent
Kinzel

(10) Patent No.: US 7,612,553 B2
(45) Date of Patent: Nov. 3, 2009

(54) CURRENT SENSOR HAVING SANDWICHED MAGNETIC PERMEABILITY LAYER

(75) Inventor: Helmut Kinzel, Weinheim (DE)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/851,981

(22) Filed: Sep. 7, 2007

(65) Prior Publication Data

US 2009/0027047 A1  Jan. 29, 2009

Related U.S. Application Data

(60) Provisional application No. 60/952,105, filed on Jul. 26, 2007.

(51) Int. Cl.
*G01R 15/20* (2006.01)
*G01R 33/07* (2006.01)
*G01R 15/18* (2006.01)
*G01R 19/20* (2006.01)

(52) U.S. Cl. ................... 324/117 H; 324/117 R
(58) Field of Classification Search .............. 324/117 H
See application file for complete search history.

(56) References Cited

U.S. PATENT DOCUMENTS

| | | | |
|---|---|---|---|
| 2,678,357 A * | 5/1954 | Schuessler | ............ 360/3 |
| 3,436,650 A * | 4/1969 | Hinton | ............ 324/244 |
| 4,559,495 A | 12/1985 | Lienhard et al. | |
| 4,687,987 A | 8/1987 | Kuchnir et al. | |
| 4,890,083 A | 12/1989 | Trenkler et al. | |
| 4,894,610 A | 1/1990 | Friedl et al. | |
| 5,017,859 A * | 5/1991 | Engel et al. | ............ 324/127 |
| 5,296,802 A | 3/1994 | Beranger et al. | |
| 5,642,041 A | 6/1997 | Berkcan | |
| 5,694,103 A * | 12/1997 | Goodwin et al. | ............ 336/178 |
| 5,831,424 A | 11/1998 | Jensen | |
| 6,005,383 A | 12/1999 | Savary et al. | |
| D420,297 S | 2/2000 | Cattaneo | |
| 6,040,688 A | 3/2000 | Strübin | |
| 6,727,683 B2 * | 4/2004 | Goto et al. | ............ 324/117 H |
| 6,781,358 B2 * | 8/2004 | Goto et al. | ............ 324/117 H |
| 6,876,189 B2 * | 4/2005 | Takatsuka et al. | ....... 324/117 H |
| D505,870 S | 6/2005 | Vuillermoz | |

(Continued)

FOREIGN PATENT DOCUMENTS

DE       19549181       7/1997

(Continued)

*Primary Examiner*—Ha Tran T Nguyen
*Assistant Examiner*—Roberto Velez
(74) *Attorney, Agent, or Firm*—Patents on Demand, P.A.; Neil R. Jetter

(57) ABSTRACT

A current sensor includes a support structure (12), a magnetic field sensor (11) positioned on the support structure, a primary conductor comprising sandwich (13) including an electrically conducting top layer (13a) and electrically conducting bottom layer (13b), and a layer of magnetic permeable material (13c) interposed between. The magnetic permeable material (13c) is disposed around the magnetic field sensor (11) so that the magnetic field sensor (11) is at least partially surrounded by the magnetic permeable material (13c). The conductor sandwich (13) includes at least one gap (16, 17) between adjacent edges (18, 19). The magnetic field sensor (11) is positioned proximate to the gap and is operable to receive magnetic flux lines resulting from current flowing in the primary conductor.

19 Claims, 8 Drawing Sheets

U.S. PATENT DOCUMENTS

| | | |
|---|---|---|
| D510,881 S | 10/2005 | Morel |
| 6,963,182 B2 * | 11/2005 | Suzuki .................. 318/400.02 |
| 7,090,636 B2 * | 8/2006 | Kent et al. ..................... 600/9 |
| 7,129,691 B2 * | 10/2006 | Shibahara et al. ....... 324/117 H |
| 7,298,132 B2 * | 11/2007 | Woolsey et al. ......... 324/117 H |
| 2004/0008022 A1 | 1/2004 | Viola et al. |
| 2004/0095125 A1 | 5/2004 | Jones |
| 2004/0201373 A1 | 10/2004 | Kato |
| 2004/0201374 A1 | 10/2004 | Kawase |
| 2005/0073292 A1 | 4/2005 | Hastings et al. |
| 2005/0073293 A1 | 4/2005 | Hastings et al. |
| 2005/0073295 A1 | 4/2005 | Hastings et al. |
| 2005/0156587 A1 | 7/2005 | Yakymyshyn et al. |

FOREIGN PATENT DOCUMENTS

| | | |
|---|---|---|
| DE | 19741417 | 4/1999 |
| EP | 0155391 | 9/1985 |
| JP | 60-214404 | 10/1985 |
| WO | WO 00/79291 A1 | 12/2000 |

* cited by examiner

CURRENT SENSOR HAVING SANDWICHED MAGNETIC PERMEABILITY LAYER

CROSS-REFERENCE TO RELATED APPLICATIONS

This application claims the benefit of Provisional Application No. 60/952,105 entitled "CURRENT SENSOR HAVING MULTI-LAYER PRIMARY CONDUCTOR WITH MAGNETIC PERMEABILITY LAYER SANDWICHED WITHIN" filed on Jul. 26, 2007, which is hereby incorporated by reference in its entirety into the present application.

FIELD OF THE INVENTION

The present invention relates generally to electric current sensors based on magnetic field sensing.

BACKGROUND

State-of-the-art magnetic field-based current sensors generally include a magnetic field sensor, an iron core, and an amplifier. The iron core surrounds an electrical conductor, preferably comprising copper for carrying the current to be measured, the current causing a magnetic field corresponding to the intensity of the current to be generated in the iron core. The magnetic field sensor is arranged in a gap in the iron core. Thus, the field lines of the magnetic field induced in the iron core by the current to be measured pass through the magnetic field sensor. The magnetic field sensor generates an electrical output signal generally proportional to be current to be measured, and this signal is amplified by an amplifier, such as an operational amplifier.

The iron core in conventional current sensors primarily provides two functions. First, the conducting of the magnetic field induced by the current to be measured through the magnetic field sensor, and second, the screening of the magnetic field sensor from extraneous electric and magnetic fields which are known to cause measurement error. However, the use of iron cores results in a sensor cost that is too expensive for many applications.

A known improved current sensor design disclosed in EP 1192473/WO 00/79291 dispenses with the iron core and thus its expense. According to the sensor design disclosed, the primary conductor which carries the current to be measured comprises an electrically conducting ferritic material generally mixed with an electrically conducting material (e.g. copper). The primary conductor at least partially surrounds the magnetic field sensor which assumes the functions of the iron core. The magnetic field sensor is centered near a notch in the primary conductor which serves to focus the magnetic flux lines from the primary current in the primary conductor that reaches the magnetic field sensor. The current sensor design disclosed in EP 1192473/WO 00/79291 generally has the disadvantage that the electromagnetic field associated with the current to be measured generates a magnetic field in the primary conductor, which can prevent precise measurement of the magnetic field associated with the current to be measured in the notch by adding another magnetic field component. The remanance of the primary conductor also causes non-linearity and magnetic saturation in the region of the notch which degrades the effect of the focussing notch. If only magnetic permeable material is used for the primary conductor (without copper or other electrical conductor), then a large cross-sectional area of this expensive material is generally needed because of its relatively high electrical resistivity.

Thus, although sensors disclosed in EP 1192473/WO 00/79291 having a primary conductor including magnetic permeable material mixed with electrically conducting material can provide good performance and a reduced cost compared to conventional iron core-based current sensors, in certain important applications more precise measurement of electric current is required. Precise measurement of electric current requires improved linearity (between the current to be measured flowing as primary current and the magnetic flux reaching the magnetic sensor) and reduced resistive impedance. Lower cost would also be helpful.

Some present current sensor applications include measurement of electric current include motor current control in frequency inverters, phase current control in servo-drives, overload protection for motors and power semiconductors, control of energy systems (e.g. wind energy), current control and monitoring in welding equipment, current regulation in switching mode power supplies, current control in uninterruptible power supplies, battery current diagnosis in motor vehicles, ground fault detection and laboratory test equipment. Some of these applications generally require precise current measurements.

Small sensor size is required in certain applications, such as those where current is measured directly on a printed circuit board. Moreover, low cost is also required in most automotive applications and other high volume applications. What is needed is a new current sensor design that provides improved sensor performance while also providing a low cost.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

A current sensor comprises a magnetic field sensor, a primary conductor comprising sandwich comprising an electrically conducting top layer and electrically conducting bottom layer, and a layer of magnetic permeable material interposed between. The magnetic permeable material is disposed around the magnetic field sensor so that the magnetic field sensor is at least partially surrounded by the magnetic permeable material which thus provides field screening. The conductor sandwich includes at least one gap, such as a notch between adjacent edges. The gap in the conductor sandwich can generally be filled with any dielectric, such as air (or other ambient) in one embodiment of the invention.

The magnetic field sensor is positioned proximate to the gap and is operable to receive magnetic flux lines resulting from current flowing in the primary conductor. In one embodiment the gap comprises a notch in each of two opposite portions. In another embodiment, the adjacent edges overlap one another. The magnetic field sensor is generally positioned at least partially over the gap, and in one embodiment is centered over the gap.

The electrically conducting top and bottom layers can comprise primarily copper, and in one embodiment consist essentially of copper. In one embodiment the magnetic permeable material comprises an iron-nickel copper alloy that provides a magnetic permeability of at least 1,000 µN/A$_2$ at 0.002 T and zero frequency.

The support structure can comprises a substrate having a semiconductor surface (e.g. silicon substrate), wherein the current sensor is an integrated current sensor formed on the surface. In this embodiment, an amplifier can be formed on the surface coupled to an output of the magnetic field sensor.

A control system comprises a current sensor as described above and a controller coupled to receive the current sensing signal and operably coupled to control at least one system. The controller can comprises an electric drive system controller for an automobile, such as for controlling motor and phase current in the electronic drive system. In this embodiment the support structure comprises a substrate having a semiconductor surface, wherein said current sensor is an integrated current sensor formed on the surface, and further comprises an amplifier formed on the surface coupled to an output of the magnetic field sensor.

FIGURES

A fuller understanding of the present invention and the features and benefits thereof will be accomplished upon review of the following detailed description together with the accompanying drawings, in which:

FIG. 1(a) is a highly simplified diagram of an exemplary current sensor according to one embodiment of the invention in side view, while

DETAILED DESCRIPTION

Figure 1A:
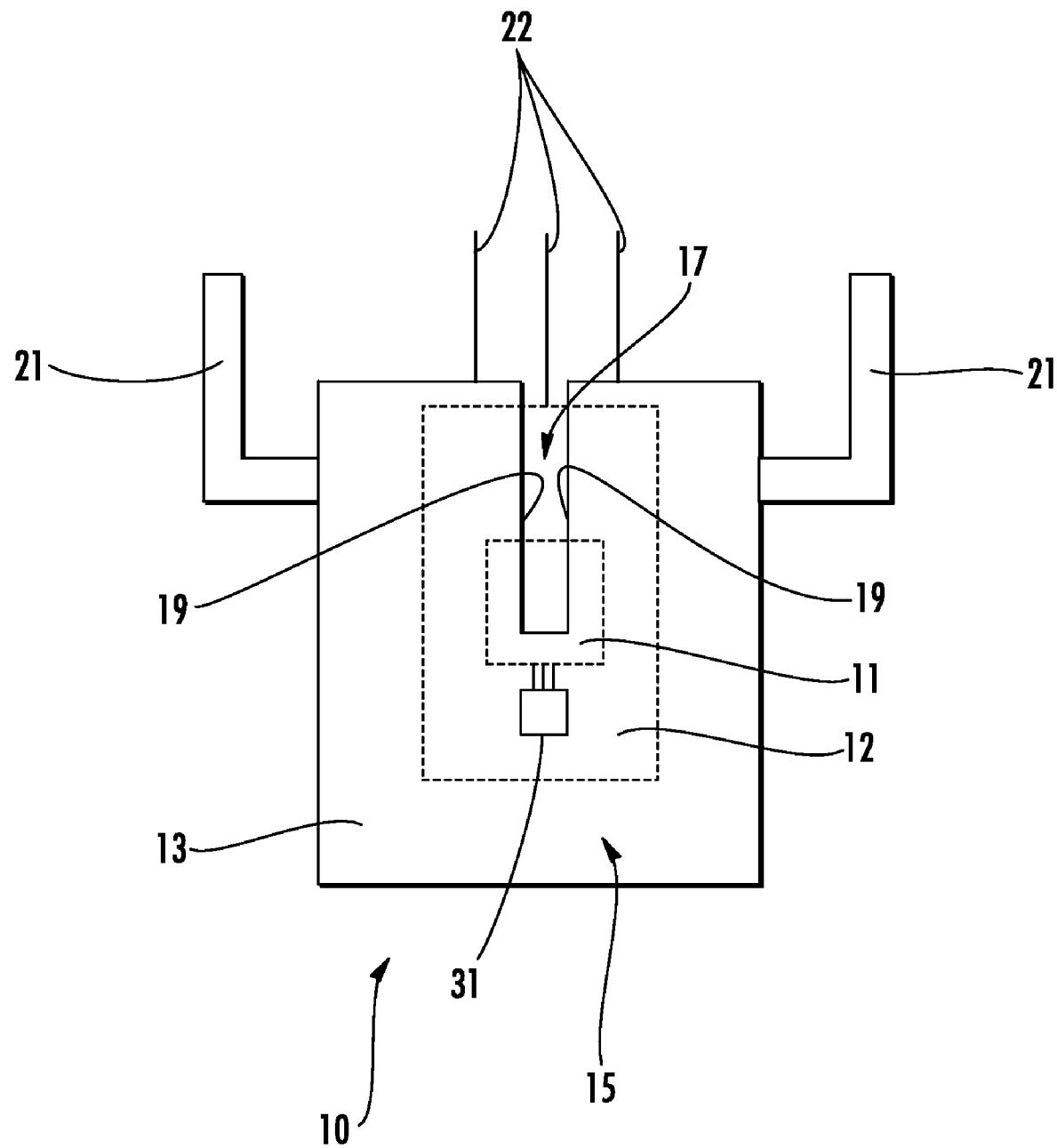

FIG. 1(a) shows a current sensor 10 according to an embodiment of the invention in a highly simplified illustration. The current sensor 10 comprises a magnetic field sensor 11 which is disposed on an optional support structure, such as a support plate 12. Magnetic field sensor 11 can generally comprises any magnetic field measuring technology, with or without an amplifier coupled to its output. For example, magnetic field sensor 11 can be a Hall-effect sensor or a magnetoresistive (MR) sensor.

An amplifier 31 is shown on support plate 12 and coupled to receive and amplify the electrical output signal provided by the magnetic field sensor 11. As known in the art, Hall effect sensors are based on the Hall effect which refers to the potential difference (Hall voltage) on the opposite sides of an electrical conductor (or semiconductor) through which an electric current is flowing, created by a magnetic field applied perpendicular to the direction of the current. A magnetoresistor (MR) is a well known device that changes its resistance in response to a change in the magnetic field. The magnetoresistive effect is known to be particularly large in permalloys, which are nickel-iron alloys, and other ferromagnetic materials.

MR sensors are generally adapted for relatively low current sensing, while Hall-effect sensors are generally adapted for relatively higher level current sensing. MR sensors are known to have higher sensitivity and dynamic range as compared to Hall-effect sensors. If a MR sensor is used as sensor 11, it may be necessary to modify its mounting as known in the art.

In accordance with an embodiment of the invention, the magnetic field sensor 11 is at least partially surrounded by the primary conductor sandwich 13 which carries the current to be measured. The conductor sandwich 13 according to the present invention is generally arranged to make use of the physics property that in the center of an electrical conductor essentially no electromagnetic field can be build up from its own current. This inventive aspect effective eliminates the disadvantage described above based on current sensors disclosed in EP 1192473/WO 00/79291 where the electromagnetic field associated with the current to be measured generates a magnetic field in the primary conductor, which can prevent precise measurement of the magnetic field associated with the current to be measured in the notch by adding another magnetic field component. This aspect of the present invention together with having the magnetic permeable layer 13(c) on the inside surface of a pair of electrical conductors 13(a) and 13(b) (shown in FIG. 1(b) described below) protects the magnetic sensor from external (stray) magnetic fields by leading the stray fields away from the magnetic sensor generally resulting in significantly better sensor performance (e.g. linearity, accuracy), as compared to current sensors disclosed in EP1192473/WO 00/79291.

Figure 1B:
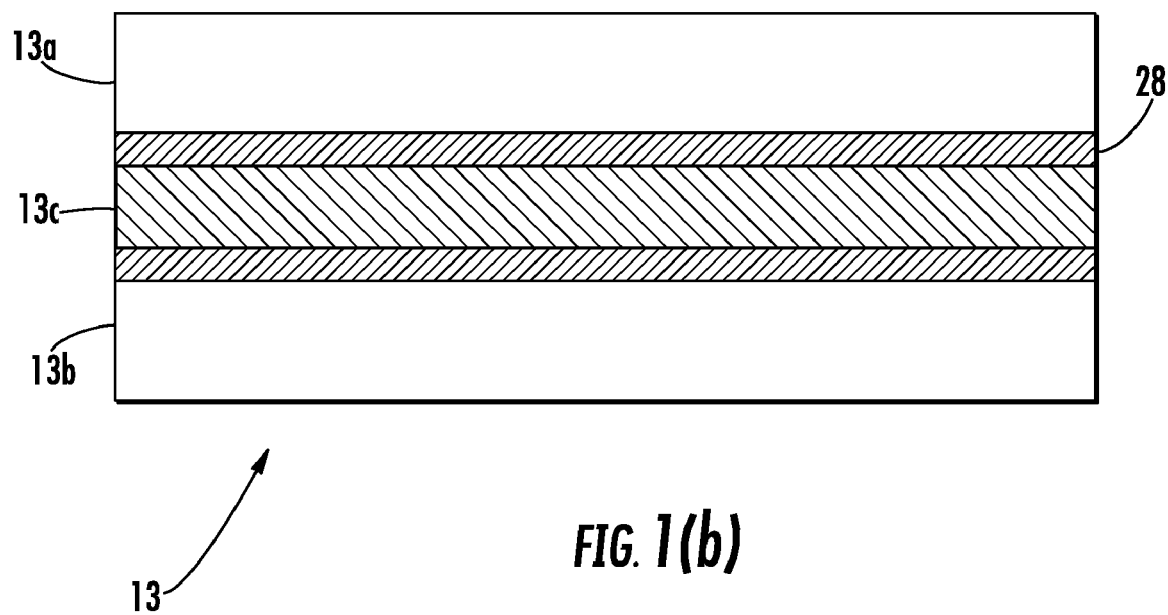
FIG. 1(b) shows details regarding the multi-layer conductor sandwich in cross section view.

Details regarding the multi-layer conductor sandwich 13 are shown in the exemplary inventive arrangement shown in cross section view in FIG. 1(b). Conductor sandwich 13 comprises an electrically conducting top layer 13(a) and electrically conducting bottom layer 13(b), having a layer of magnetic permeable material 13(c) interposed between. Although shown having comparable thicknesses, the thickness of magnetic permeable material 13(c) is generally more than an order of magnitude thinner as compared to the thickness of conducting top layer 13(a) and bottom layer 13(b). In a preferred embodiment, the electrically conducting top layer 13(a) and bottom layer 13(b) should be coupled together via a low resistance connection or be electrically common. In one arrangement, the respective layers are secured to one another using an electrically conductive adhesive 28. Non-electrically conducting adhesives or other methods for securing the respective layers together may also be used.

Most highly magnetic permeable materials generally provide a lower electrical conductivity as compared to the electrical conductivity of certain available low cost non-magnetic permeable materials, such as copper. Thus, in arrangements where the highly magnetic permeable material caries the current to be measured, such as disclosed in EP 1192473/WO 00/79291, the highly magnetic permeable material must be made thicker (and or wider) to obtain a required low impedance level. Since the respective layers of conductor sandwich 13 according to the present invention are electrically in parallel and the electrical conductivity of electrically conducting top and bottom layers 13(a) and 13(b) is significantly higher as compared to the magnetic permeable material 13(c), the electrically conducting top and bottom layers 13(a) and 13(b) carry most of the current to be measured. In one embodiment of the invention, electrically conducting top and bottom layers 13(a) and 13(b) are generally exclusive of magnetically permeable material.

Thus, a significant advantage of conductor sandwich 13 results because top and bottom conductor 13(a) and 13(b) absorb little of the magnetic field lines needed to measure the primary current. Moreover, by removing the need for primary conductor 13 to provide both high electrically conductivity and magnetic permeability required by the single layer primary conductor 13 disclosed in EP 1192473/WO 00/79291, the current in current sensor 10 can thus be carried by relatively low cost highly electrically conducting generally non-magnetic permeable materials, such as copper.

In one embodiment of the invention the thickness of the electrically conducting portions 13(a) and 13(b) of conductor sandwich 13 is generally on the order of 1 mm for 25 A of current, and the width of conductor sandwich 13 is generally about 5 to 40 mm, such as 10 to 20 mm. The overall thickness of the conductor sandwich 13 is generally 3 to 10 mm. The thickness of magnetic permeable material 13c is generally from 0.1 to 0.5 mm.

Conductor sandwich 13 can have a strip-form design. The conductor sandwich 13 then surrounds the magnetic field sensor 11 in tubular fashion. It is also possible for this tubular arrangement of the conductor sandwich 13 to be closed at the top and/or bottom so that the conductor sandwich 13 surrounds the magnetic field sensor 11 in a cartridge-like or casing-like fashion. In another embodiment the magnetic field sensor 11 can be mounted in a plastic molding.

As described above, the magnetic permeable material 13(c) of conductor sandwich 13 screens the magnetic field sensor 11 from extraneous magnetic and electric fields, while the electrically conducting portions 13a and 13(b) of conductor sandwich 13 provide electric field screening. Thus, for example, conductor sandwich 13 provides screening from electric fields from various sources including primary side voltage peaks, as well as external magnetic fields which can arise from various sources. The conductor sandwich 13 also leads the magnetic field generated by the current to be measured through the magnetic field sensor 11.

The magnetic permeable material 13c can be made from a variety of magnetic permeable materials. As used herein, the term "magnetic permeable material" refers to a material that provides a permeability (µ) of at least 500 µN/$A_2$ at 0.002 T and zero frequency. The magnetic permeable material 13(c) is generally an iron or a ferrous alloy. In one embodiment, magnetic permeable material 13c comprises Mu-metal. Mu-metal is a nickel-iron alloy (75% nickel, 15% iron, plus copper and molybdenum) that has a very high magnetic permeability, about 25,000 µN/$A_2$ at 0.002 T and zero frequency. A high magnetic permeability layer 13(c) is generally effective at screening static or low-frequency magnetic fields. The magnetic permeable material 13(c) can also have a bimetallic configuration, in which case Mu-metal may be combined with one or more metals, such as copper, in amounts from 10 to about 70 wt %.

Figure 2:
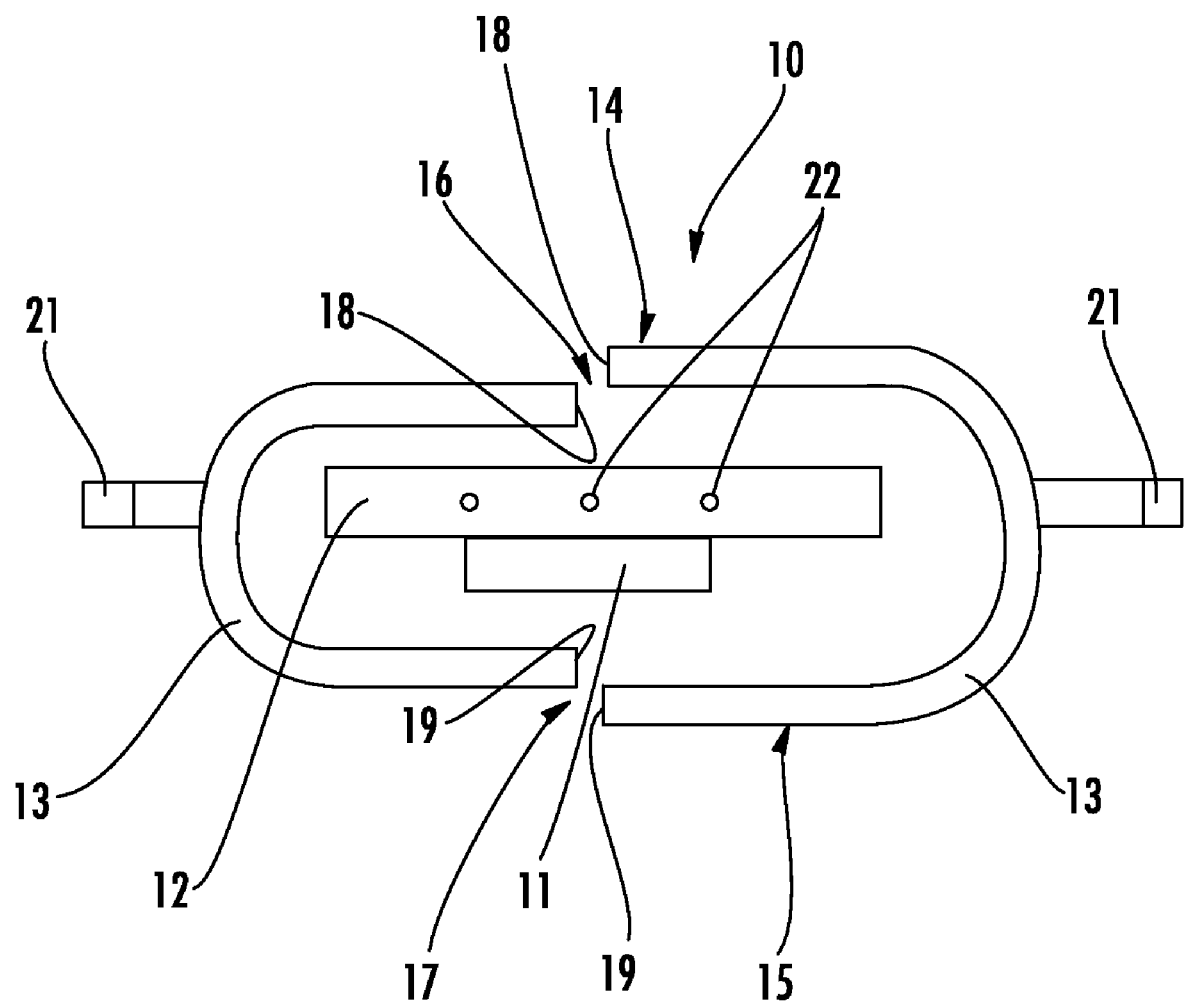
FIG. 2 is a highly simplified diagram of the current sensor of FIG. 1 in top view.

FIG. 2 is a highly simplified diagram of the current sensor 10 of FIG. 1 in top view. Feature 21 corresponds to electrically conducting terminals the permits the sensor 10 to be connected to a current carrying line to be measured while terminals 22 provide the three terminal electrical output from sensor 11 which is generally required when sensor 11 is embodied as a Hall-effect sensor. The conductor sandwich 13 configured in accordance with the invention can be seen to have two gaps 16 and 17 which provide breaks in the electrical continuity between adjacent electrical conductor portions. Although gaps 16 and 17 are shown having a notch-like shape, other gap shapes can be used, including non-uniform shapes. A gap shown as a notch 16, 17 in each of two opposite portions 14, 15 of conductor sandwich 13, with the adjacent edges 18, 19 respectively, is shown in FIG. 2. The magnetic field sensor 11 is shown positioned in the zone of the notch 17. The presence of the gaps, such as notches 16, 17, causes the current flowing through the conductor sandwich 13 to be led in a generally U-shaped path (see FIG. 3), and as a result the field lines of the magnetic field generated by the current to be measured being led through the magnetic field sensor 11. The conductor sandwich 13 therefore serves as forward and return electrical conductor. It is noted that the adjacent edges 18 and 19 may also overlap without physically touching one another other to also provide a gap. An overlapping arrangement is shown in FIG. 4(b), as described below.

Figure 3:
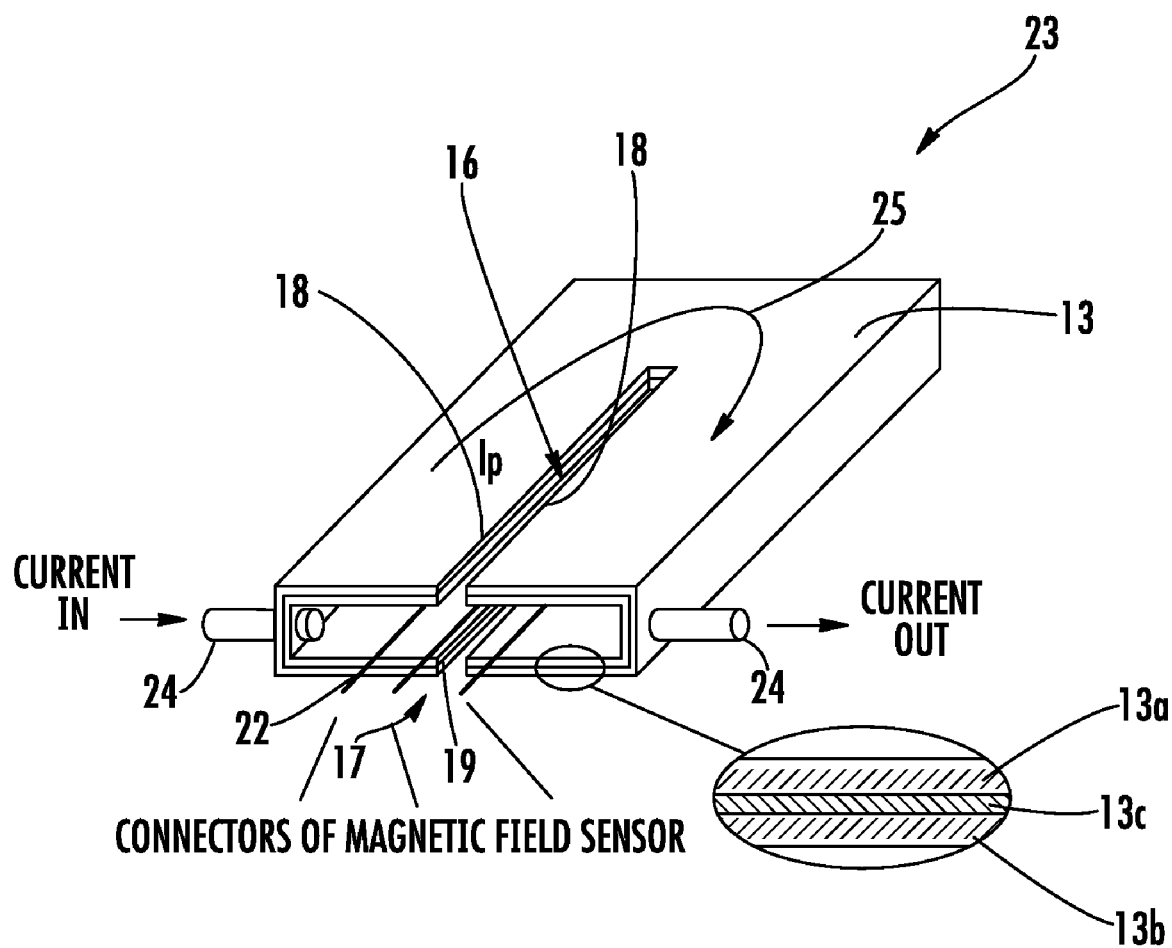
FIG. 3 is a highly simplified diagram of another current sensor according to another embodiment of the invention in perspective view.

FIG. 3 shows a current sensor 23 which basically corresponds to the current sensor 10 of FIGS. 1 and 2 but has straight terminals 24. In other respects, the current sensor 23 generally corresponds to current sensor 10. The same reference numbers are therefore used for the same components. The arrow 25 shows how the current flowing through the conductor 13 is led in a generally U-shaped path. Although shown having an open end upon which the three (3) output terminals 22 emerge therefrom, the case can be enclosed (not shown) making provision not to short output terminals 22 together. It is possible to generally electrically short the electrically conducting top layer 13(a) and bottom layer 13(b), provided the shorting does not short across notches 16, 17 which would interrupt the desired generally U-shaped current pattern.

Figure 4A:
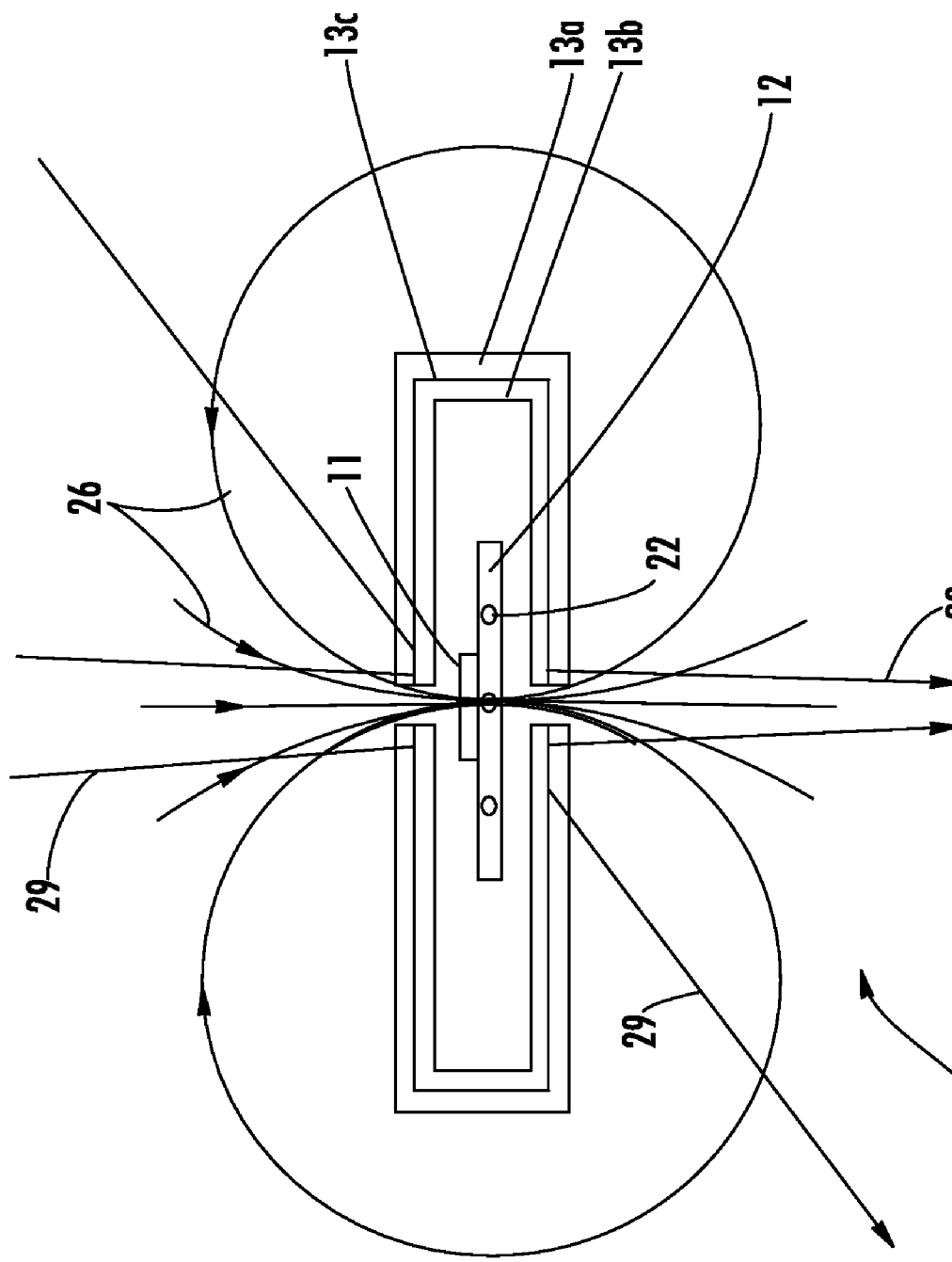
FIG. 4(a) illustrates a current sensor according to an embodiment of the present invention showing the pattern of magnetic field lines from primary conductor current through the magnetic field sensor current and field lines from external stray fields being led away from the magnetic field sensor.

FIG. 4(a) illustrates a current sensor 400 according to an embodiment of the present invention showing the pattern of magnetic field lines from primary conductor current 26 through the magnetic field sensor 11 and external stray magnetic field lines 29 being led away from the magnetic field sensor 11. The lowest magnetic resistance path is through the center around magnetic sensor 11.

Figure 4B:
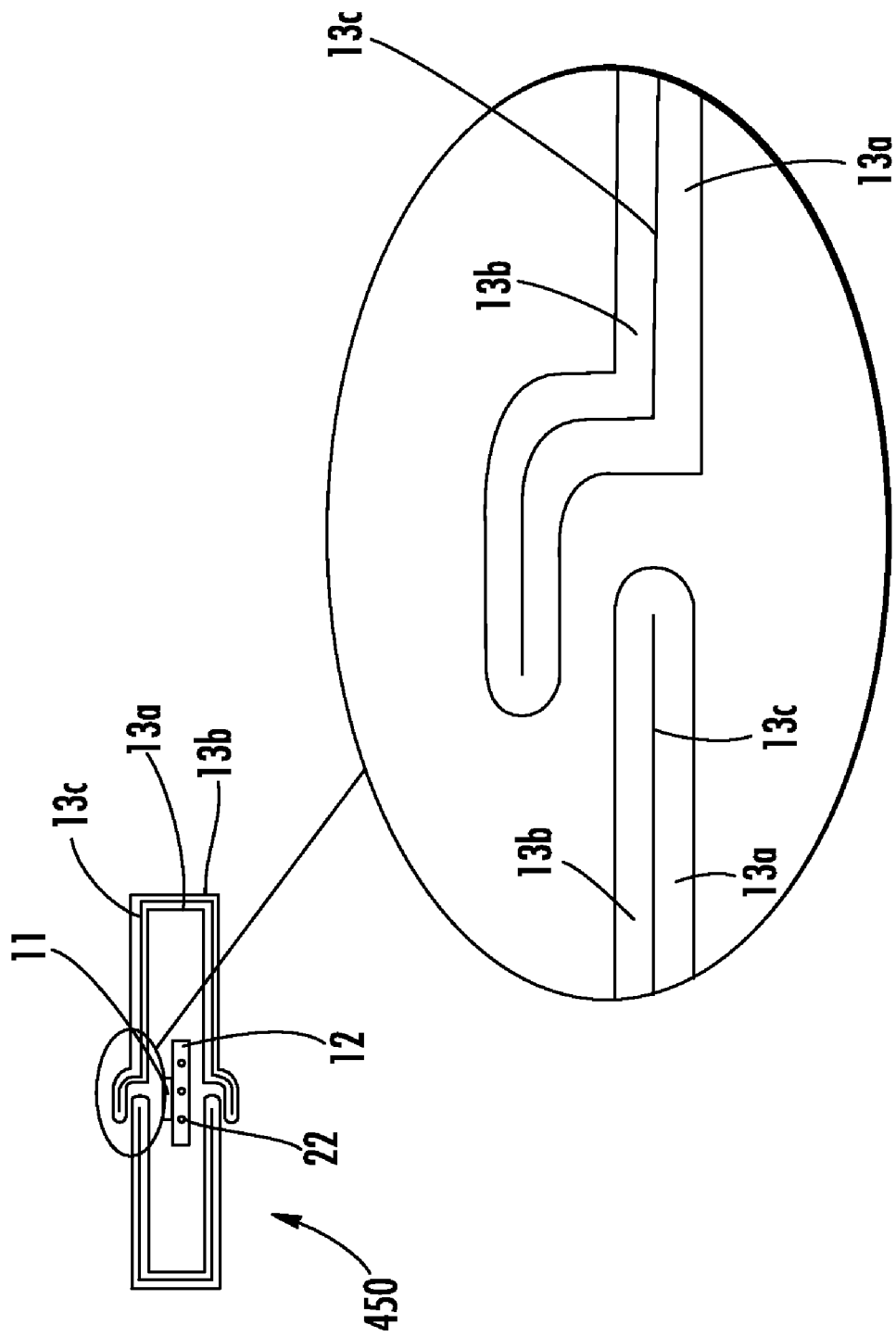
FIG. 4(b) shows a current sensor according to another embodiment of the present invention having a primary conductor arrangement which provides overlapping conductor sandwich edges for enhanced measurement linearity and immunity against external stray fields.

FIG. 4(b) shows a current sensor 450 according to another embodiment of the present invention having a primary conductor arrangement which provides overlapping conductor sandwich edges for enhanced immunity against external stray fields. An expanded view of the overlap arrangement is also provided. The overlapping arrangement together with the conductor sandwich 13 can avoid or at least help prevent saturation of the magnetically permeable material near the edges of conductor sandwich 13 and thus can provide improved linearity.

As shown in the expanded view provided in FIG. 4(b), the magnetic permeable layer 13(c) is recessed, and thus does not reach the surface of the conductor sandwich 13 at the edges of conductor sandwich 13. This arrangement provides protection for the magnetic permeable layer 13(c) from the magnetic field generated by the primary current. As shown, the edges of conductor sandwich 13 are rounded by end region which includes only electrically conductive layers 13(a) and 13(b). In one embodiment, the distance between edge surface of conductor sandwich 13 and the edge of the magnetic permeable material 13(c) is at least equal to the thickness of one of the electrically conductive layers 13(a) and 13(b).

Figure 5A:
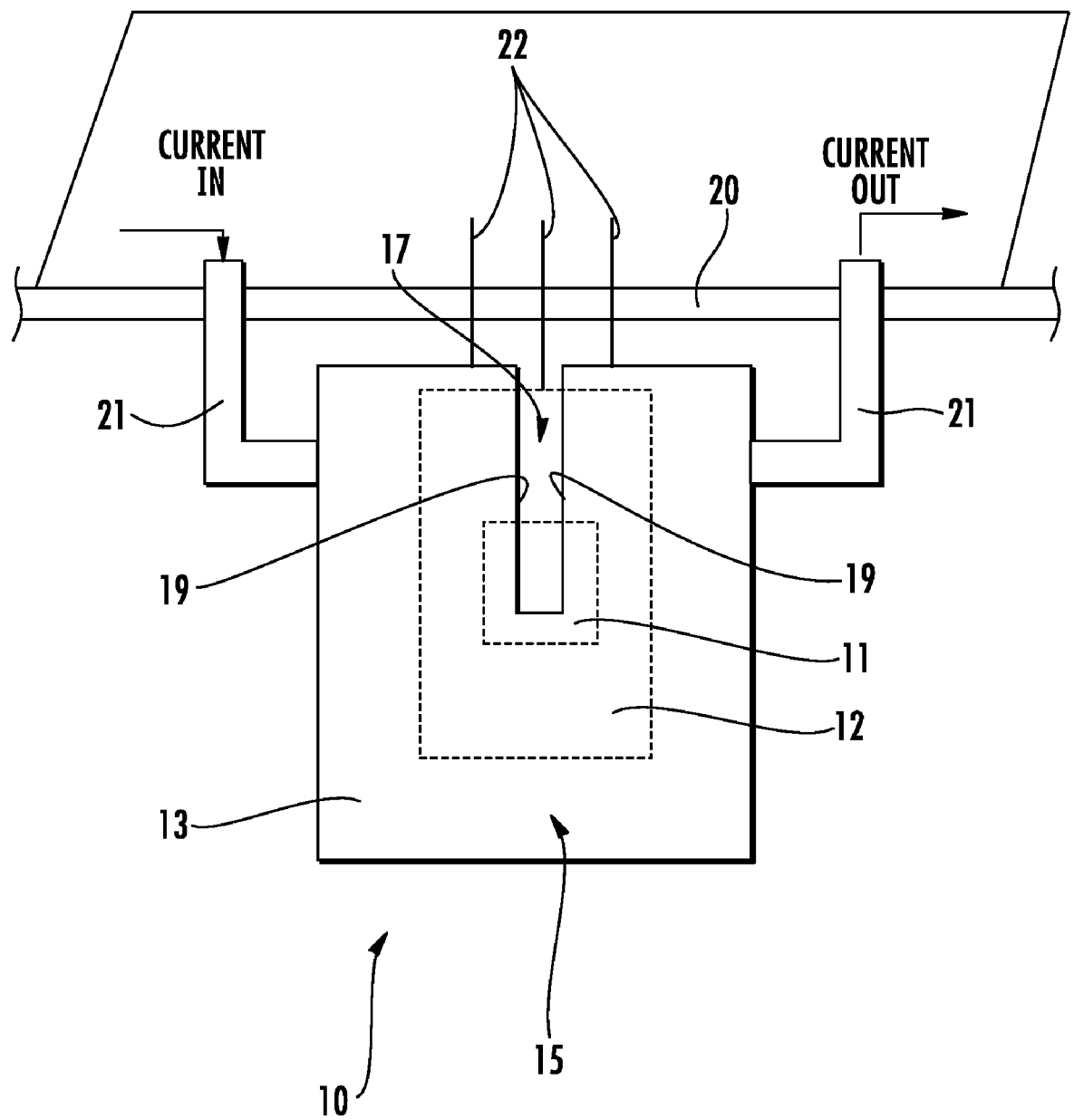
FIG. 5(a) shows the current sensor of FIG. 1 sensing a current flowing on a printed circuit board.

FIG. 5(a) shows a current sensor 10 according to the invention in one of its applications of measuring the current carried by a conducting line on a printed circuit board (PCB) 20. Although not shown, current sensor is generally soldered to PCB 20 and thus placed in series with one or more current carrying lines to be measured on PCB 20. The conductor sandwich 13 is shown contacting current carrying line on PCB 20 via conducting terminals 21. In this arrangement, the sensor 10 is perpendicular to the plane of PCB 20. Electrical data signals (voltage) from current sensor 10 can be tapped via terminals 22 (3 terminals shown for a Hall-effect sensor) for further processing, such as for filtering and amplification.

Sensors according to the present invention can also be formed on integrated circuit substrates, such as silicon, particularly for lower current sensing, such as milliamps up to several amps (e.g. up to 25 A). In this embodiment, support structure 12 comprises an integrated circuit substrate having a semiconducting surface, such as a silicon substrate. Processing is performed such that the magnetic field sensor 11 is substantially surrounded by the multi-layer conductor sandwich 13 on all sides. Copper is currently commonly used as the metallization on modern integrated circuits which include a plurality of metallization levels, due to its relatively low cost, high electrically conductivity, and resistance to electromigration. Magnetic (ferric) materials are routinely deposited on integrated circuits for circuits such as Fe-RAMs.

Figure 5B:
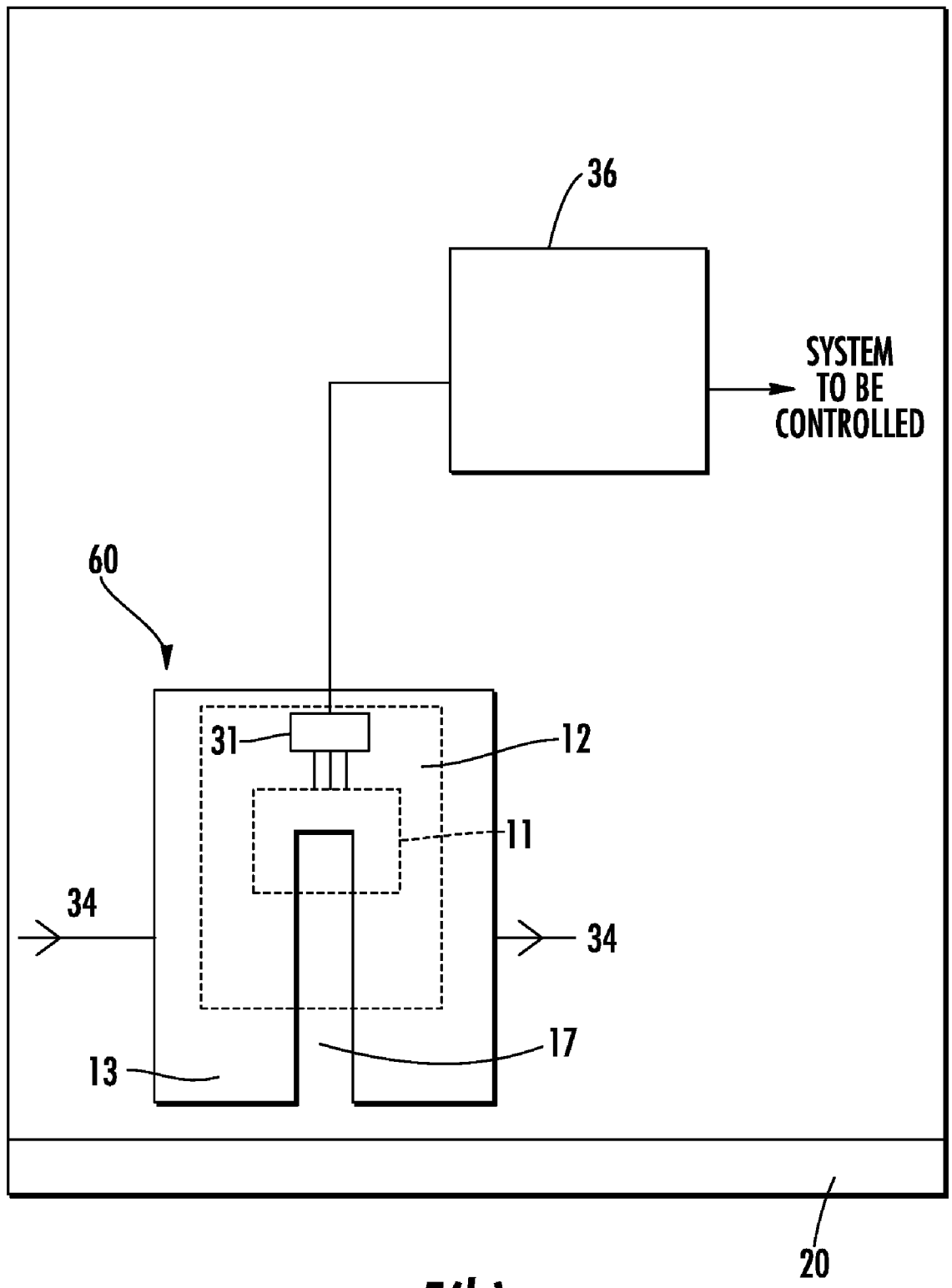
FIG. 5(b) is a depiction of a current sensor IC designed as an application specific integrated circuit (ASIC) comprising a Hall-effect or MR sensor coupled to an amplifier, according to an embodiment of the invention.

This embodiment allows sensors according to the present invention to be formed on the same chip as filters and amplifiers (e.g. operation amplifiers) for processing the signals generated by sensors according to the present invention. Fabrication of sensors according to the present invention as ICs, has the advantage of allowing mounting of integrated sensors to be in small packages (plastic dips) and be mounted on the PCB board parallel to the plane of the board, thus reducing the clearance required. FIG. 5(b) shows a depiction of a current sensor IC 60 according to the present invention designed as an application specific integrated circuit (ASIC) comprising a Hall-effect or MR sensor 11 coupled to an amplifier 31 formed on a common substrate (e.g. substrate having a silicon surface) 12 and typically package in a single package, such as a plastic package. Pins (not shown) of the package are inserted into suitable connectors provided on PCB board 20. The current to be measured is shown flowing along conducting line 34. The amplified sensor output from amplifier 31 is coupled to controller 36. In one embodiment controller 36 comprises an electric drive system controller for an automobile, such as for controlling motor and phase current in the electronic drive system of the automobile.

Recent advances have resulted in the ability to also add an ADC (Analog to Digital) converter and I$_2$C (Inter-integrated circuit communication protocol) IC for direct connection to a microcontroller's I/O port which can also be integrated into a single package. In another embodiment, the sensor IC can include both Hall-effect and MR-based sensors, with a switch for switching between the respective sensors based on a predetermined current level. In one embodiment, the MR-based sensor is operable at lower current, while the Hall-effect sensor would be operable at higher current. The sensor signal could also be temperature compensated using known temperature sensor circuits (PTATs). Moreover, the IC can also including a wireless transmitter and on-chip antenna for transmitting the detected signal to a remote monitoring location.

Current sensors according to the invention have been found to provide very good linearity and accuracy, and low temperature drift. High bandwidth has also been found to be provided. Accordingly, based on the performance provided and low manufacturing cost, the invention is expected to have a wide range of applications.

In the preceding description, certain details are set forth in conjunction with the described embodiment of the present invention to provide a sufficient understanding of the invention. One skilled in the art will appreciate, however, that the invention may be practiced without these particular details. Furthermore, one skilled in the art will appreciate that the example embodiments described above do not limit the scope of the present invention and will also understand that various modifications, equivalents, and combinations of the disclosed embodiments and components of such embodiments are within the scope of the present invention.

Moreover, embodiments including fewer than all the components of any of the respective described embodiments may also within the scope of the present invention although not expressly described in detail. Finally, the operation of well known components and/or processes has not been shown or described in detail below to avoid unnecessarily obscuring the present invention. One skilled in the art will understood that even though various embodiments and advantages of the present Invention have been set forth in the foregoing description, the above disclosure is illustrative only, and changes may be made in detail, and yet remain within the broad principles of the invention. For example, some of the components described above may be implemented using either digital or analog circuitry, or a combination of both, and also, where appropriate may be realized through software executing on suitable processing circuitry. The present invention is to be limited only by the appended claims.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

I claim:

1. A current sensor, comprising:
    a magnetic field sensor;
    a sandwich carrying a current comprising an electrically conducting top layer and electrically conducting bottom layer, and a layer of metal comprising magnetic permeable material interposed between, wherein each of said magnetic permeable material, said electrically conducting top layer and said electrically conducting bottom layer carry a portion of said current, said magnetic permeable material being disposed around said magnetic field sensor so that said magnetic field sensor is at least partially surrounded by said magnetic permeable material, and wherein said sandwich includes at least one gap between adjacent edges,
    wherein said magnetic field sensor is positioned proximate to said gap and is operatively receiving magnetic flux lines resulting from said current flowing in said sandwich.

2. The current sensor of claim 1, wherein said gap comprises a notch in each of two opposite portions.

3. The current sensor of claim 1, wherein said adjacent edges overlap one another.

4. The current sensor of claim 1, wherein said magnetic field sensor is positioned at least partially over said gap.

5. The current sensor of claim 4, wherein said magnetic field sensor is centered over said gap.

6. The current sensor of claim 1, wherein said electrically conducting top and bottom layers comprise primarily copper.

7. The current sensor of claim 1, wherein said magnetic permeable material comprises an iron-nickel copper alloy that provides a magnetic permeability of at least 1,000µN/A$^2$ at 0.002 T and zero frequency.

8. The current sensor of claim 1, further comprising a support structure, said magnetic field sensor being positioned on said support structure, wherein said support structure comprises a substrate having a semiconductor surface, said current sensor being an integrated current sensor formed on said surface.

9. The current sensor of claim 8, further comprising an amplifier formed on said surface coupled to an output of said magnetic field sensor.

10. The current sensor of claim 1, wherein said magnetic field sensor comprises a Hall-effect sensor.

11. The current sensor of claim 1, wherein said magnetic field sensor comprises a magneto resistance-based sensor.

12. The current sensor of claim 1, wherein said sandwich surrounds said magnetic field sensor both above and below as well as laterally except in regions defined by said gap.

13. The current sensor of claim 1, wherein said electrically conducting top and bottom layers consist of non-magnetic permeable materials.

14. A control system, comprising:
- a current sensor for providing a current sensing signal representative of a current received comprising:
- a magnetic field sensor,
- a sandwich carrying said current comprising an electrically conducting top layer and electrically conducting bottom layer, having a layer of metal comprising magnetic permeable material interposed between, wherein each of said magnetic permeable material, said electrically conducting top layer and said electrically conducting bottom layer carry a portion of said current, said magnetic permeable material being disposed around said magnetic field sensor so that said magnetic field sensor is at least partially surrounded by said magnetic permeable material, wherein said sandwich has at least one gap between adjacent edges and wherein said magnetic field sensor is positioned proximate to said gap and is operatively receiving magnetic flux lines resulting from said current flowing in said sandwich, and
- a controller coupled to receive said current sensing signal and operably coupled to control at least one system.

15. The system of claim 14, wherein said controller comprises an electric drive system controller for an automobile.

16. The system of claim 15, wherein said current comprises motor and phase current and said controller controls said motor and phase current in said electronic drive system.

17. The system of claim 14, further comprising a support structure, said magnetic field sensor being positioned on said support structure, wherein said support structure comprises a substrate having a semiconductor surface, said current sensor being an integrated current sensor formed on said surface field sensor.

18. The system of claim 17, further comprising an amplifier formed on said surface coupled to an output of said magnetic field sensor.

19. The system of claim 14, wherein said magnetic field sensor comprises a Hall-effect sensor.

* * * * *